(12) United States Patent
Yokoi

(10) Patent No.: US 8,263,966 B2
(45) Date of Patent: Sep. 11, 2012

(54) PHOTODETECTOR AND METHOD FOR MANUFACTURING PHOTODETECTOR

(75) Inventor: Akihito Yokoi, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 13/293,801

(22) Filed: Nov. 10, 2011

(65) Prior Publication Data

US 2012/0056243 A1    Mar. 8, 2012

Related U.S. Application Data

(62) Division of application No. 12/439,234, filed as application No. PCT/JP2007/066539 on Aug. 27, 2007, now Pat. No. 8,101,940.

(30) Foreign Application Priority Data

Aug. 29, 2006 (JP) ................ P2006-232546

(51) Int. Cl.
  H01L 29/06 (2006.01)
  H01L 31/0328 (2006.01)
  H01L 31/0336 (2006.01)
  H01L 31/072 (2012.01)
  H01L 31/109 (2006.01)
(52) U.S. Cl. .......... 257/21; 257/184; 257/E33.076; 257/E31.115
(58) Field of Classification Search .......... 257/21, 257/184, E33.076, E31.115
See application file for complete search history.

(56) References Cited

U.S. PATENT DOCUMENTS

| 5,189,309 A | 2/1993 | Wada et al. |
| 6,433,366 B1 | 8/2002 | Takimoto et al. |
| 2002/0137246 A1 | 9/2002 | Takimoto et al. |

FOREIGN PATENT DOCUMENTS

| EP | 0 347 157 | 12/1989 |
| EP | 0 470 783 | 2/1992 |
| JP | 2-002691 | 1/1990 |
| JP | 4-092479 | 3/1992 |
| JP | 4-152670 | 5/1992 |
| JP | 10-233523 | 9/1998 |
| JP | 2001-044484 | 2/2001 |
| JP | 2001-177142 | 6/2001 |
| JP | 1-194352 | 9/2002 |
| JP | 2005-260118 | 9/2005 |

Primary Examiner — Thien F Tran
(74) Attorney, Agent, or Firm — Drinker Biddle & Reath LLP

(57) ABSTRACT

A photodetector 1 according to an embodiment of the present invention includes: an n-type InAs substrate 12; an n-type InAs buffer layer 14 formed on the n-type InAs substrate 12; an n-type InAs light absorbing layer 16 formed on the n-type InAs buffer layer 14; an $InAs_XP_YSb_{1-X-Y}$ cap layer 18 ($X \geqq 0$, $Y>0$) formed on the n-type InAs light absorbing layer 16; a first inorganic insulating film 20 formed on the cap layer 18, and having an opening portion 20h in a deposition direction; a p-type impurity semiconductor region 24 fowled by diffusing a p-type impurity from the opening portion 20h of the first inorganic insulating film 20, and reaching from the cap layer 18 to an upper layer of the n-type InAs light absorbing layer 16; and a second inorganic insulating film 22 formed on the first inorganic insulating film 20 and on the p-type impurity semiconductor region 24.

1 Claim, 7 Drawing Sheets

PHOTODETECTOR AND METHOD FOR MANUFACTURING PHOTODETECTOR

This is a divisional application of application Ser. No. 12/439,234, having a §371 date of Apr. 14, 2009 now U.S. Pat. No. 8,101,940, which is a national stage filing based on PCT International Application No. PCT/JP2007/066539, filed on Aug. 27, 2007. The application Ser. No. 12/439,234 is incorporated by reference herein in its entirety.

TECHNICAL FIELD

The present invention relates to a photodetector and a manufacturing method of the photodetector.

Background Art

As photodetectors, photodiodes have been known. In Patent Document 1, there has been described a mesa photodiode in which a p-n junction is formed by a p-type InAsPSb semiconductor layer and an n type InAs semiconductor layer.
Patent Document 1: Japanese Published Unexamined Patent Application No. H10-233523

DISCLOSURE OF THE INVENTION

Problem to be Solved by the Invention

However, in the mesa photodiode, since the p-n junction portion is exposed, there is a large temporal change in characteristics due to moisture absorption, and thus reliability is low. Moreover, the exposure of the p-n junction portion also causes an increase in dark current.

Therefore, the present invention aims to provide a photodetector that allows improving reliability and reducing dark current.

Means for Solving the Problem

A photodetector according to the present invention includes: (a) a first conductivity-type InAs substrate; (b) a first conductivity-type InAs buffer layer formed on the first conductivity-type InAs substrate; (c) a first conductivity-type InAs light absorbing layer formed on the first conductivity-type InAs buffer layer; (d) a cap layer formed on the first conductivity-type InAs light absorbing layer, and made from $InAs_X P_Y Sb_{1-X-Y}$ ($X \geqq 0, Y > 0$) containing In and at least two of As, P, and Sb; (e) a first inorganic insulating film formed on the cap layer, and having an opening portion in a deposition direction; (f) a second conductivity-type impurity semiconductor region formed by diffusing a second conductivity-type impurity from the opening portion of the first inorganic insulating film, and reaching from the cap layer to an upper layer of the first conductivity-type InAs light absorbing layer; and (g) a second inorganic insulating film formed on the first inorganic insulating film and on the second conductivity-type impurity semiconductor layer.

A manufacturing method of a photodetector according to the present invention includes: (1) a first deposition step of depositing, on a first conductivity-type InAs substrate, a first conductivity-type InAs buffer layer, a first conductivity-type InAs light absorbing layer, a cap layer made from $InAs_X P_Y Sb_{1-X-Y}$ ($X \geqq 0, Y > 0$) containing In and at least two of As, P, and Sb, and a first inorganic insulating film, in sequence; (2) an opening portion forming step of forming, in the first inorganic insulating film, an opening portion in a deposition direction; (3) a diffusion step of forming a second conductivity-type impurity semiconductor region by diffusing a second conductivity-type impurity from the cap layer to an upper layer of the first conductivity-type InAs light absorbing layer by use of the opening portion of the first inorganic insulating film; and (4) a second deposition step of depositing a second inorganic insulating film on the first inorganic insulating film and on the second conductivity-type impurity semiconductor layer.

According to this photodetector, a second conductivity-type impurity semiconductor layer is formed by diffusing a second conductivity-type impurity by use of the opening portion of the first inorganic insulating film, and a second inorganic insulating film is formed on the first inorganic insulating film and on the second conductivity-type impurity semiconductor region, and thus a p-n junction formed by the second conductivity-type impurity semiconductor region and the first conductivity-type InAs light absorbing layer is coated with the inorganic insulating film excellent in moisture resistance. Accordingly, not only can reliability be improved, but dark current can also be reduced. Moreover, since the layers other than the second conductivity-type impurity semiconductor region including a light receiving region are coated double with the first inorganic insulating film and the second inorganic insulating film, dark current can further be reduced.

Here, the degree of lattice matching between InAs and $InAs_X P_Y Sb_{1-X-Y}$ is high. Therefore, according to this photodetector, the degree of lattice matching between the light absorbing layer and the cap layer can be improved, and crystal distortion can be reduced. Furthermore, according to this photodetector, since the second conductivity-type impurity semiconductor region reaches from the cap layer to the upper layer of the first conductivity-type InAs light absorbing layer, a sufficient absorption length can be secured to the wavelength of a to-be-detected light. As a result, the light receiving sensitivity to the wavelength of a to-be-detected light can be improved.

A photodetector according to the present invention includes: (a) a first conductivity-type InAs substrate; (b) a first conductivity-type InAs buffer layer formed on the first conductivity-type InAs substrate; (c) a first conductivity-type InAs light absorbing layer formed on the first conductivity-type InAs buffer layer; (d) a cap layer formed on the first conductivity-type InAs light absorbing layer, and made from $InAs_X P_Y Sb_{1-X-Y}$ ($X \geqq 0, Y > 0$) containing In and at least two of As, P, and Sb; (e) a first inorganic insulating film formed on the cap layer; (f) a second conductivity-type impurity semiconductor region formed by ion-implanting a second, conductivity-type impurity via the first inorganic insulating film, and reaching from the cap layer to an upper layer of the first conductivity-type InAs light absorbing layer; and (g) a second inorganic insulating film formed on the first inorganic insulating film.

A manufacturing method of a photodetector according to the present invention includes: (1) a first deposition step of depositing, on a first conductivity-type InAs substrate, a first conductivity-type InAs buffer layer, a first conductivity-type InAs light absorbing layer, a cap layer made from $InAs_X P_Y Sb_{1-X-Y}$ ($X \geqq 0, Y > 0$) containing In and at least two of As, P, and Sb, and a first inorganic insulating film, in sequence; (2) an ion implantation step of forming a second conductivity-type impurity semiconductor region by ion-implanting a second conductivity-type impurity from the cap layer to an upper layer of the first conductivity-type InAs light absorbing layer via the first inorganic insulating film; and (3) a second deposition step of depositing a second inorganic insulating film, on the first inorganic insulating film.

According to this photodetector, a second conductivity-type impurity semiconductor region is formed by ion-implanting a second conductivity-type impurity via the first inorganic insulating film, and a second inorganic insulating film is formed on the first inorganic insulating film, and thus a p-n junction portion formed by the second conductivity-type impurity semiconductor region and the first conductivity-type InAs light absorbing layer is coated double with the inorganic insulating films excellent in moisture resistance. Accordingly, not only can reliability be improved, but dark current can also be reduced.

As described above, since the degree of lattice matching between InAs and $InAs_XP_YSb_{1-X-Y}$ is high, in this photodetector as well, the degree of lattice matching between the light absorbing layer and the cap layer can be improved, and crystal distortion can be reduced. Furthermore, in this photodetector as well, since the second conductivity-type impurity semiconductor region reaches from the cap layer to the upper layer of the first conductivity-type InAs light absorbing layer, a sufficient absorption length can be secured to the wavelength of a to-be-detected light, so that the light receiving sensitivity to the wavelength of a to-be-detected light can be improved.

It is preferable that the thickness of the cap layer mentioned above is 0.8 μm or more and 1.4 μm or less. The inventor of the present application has discovered from the analysis results of experimentation that the thicker the cap layer, the more the dark current is reduced in magnitude. In this photodetector, since the thickness of the cap layer is 0.8 μm or more, dark current can further be reduced. Moreover, since the thickness of the cap layer is 1.4 μm or less, an increase in light absorption in the second conductivity-type impurity semiconductor region that is formed by doping a second conductivity-type impurity into the cap layer can be suppressed, and an increase in diffusion time or ion implantation time of the second conductivity-type impurity semiconductor region, more specifically, an increase in manufacturing time of the photodetector can be suppressed.

Moreover, it is preferable that the thickness of a light receiving region in the second conductivity-type impurity semiconductor region mentioned above is thinner than the thickness of the cap layer. According to this, the thickness of the light receiving region in the second conductivity-type impurity semiconductor region can be reduced without reducing the thickness of the cap layer, and thus light absorption in the second conductivity-type impurity semiconductor region can be reduced without increasing dark current.

Moreover, it is preferable that the cap layer mentioned above contains a first conductivity-type impurity, and a concentration distribution of the first conductivity-type impurity in at least a part of a lower layer of the cap layer slopes so that the concentration increases from the first conductivity-type InAs light absorbing layer toward the cap layer. According to this configuration, the concentration of a first conductivity-type impurity in at least a part of the lower layer of the cap layer increases continuously or in a graded manner, and thus the energy band gap increases from the light absorbing layer toward the cap layer continuously or in a graded manner. Accordingly, carriers migrate smoothly, which allows operating at a high speed.

Effects of the Invention

The present invention allows improving reliability of a photodetector and reducing dark current.

Figure 1:
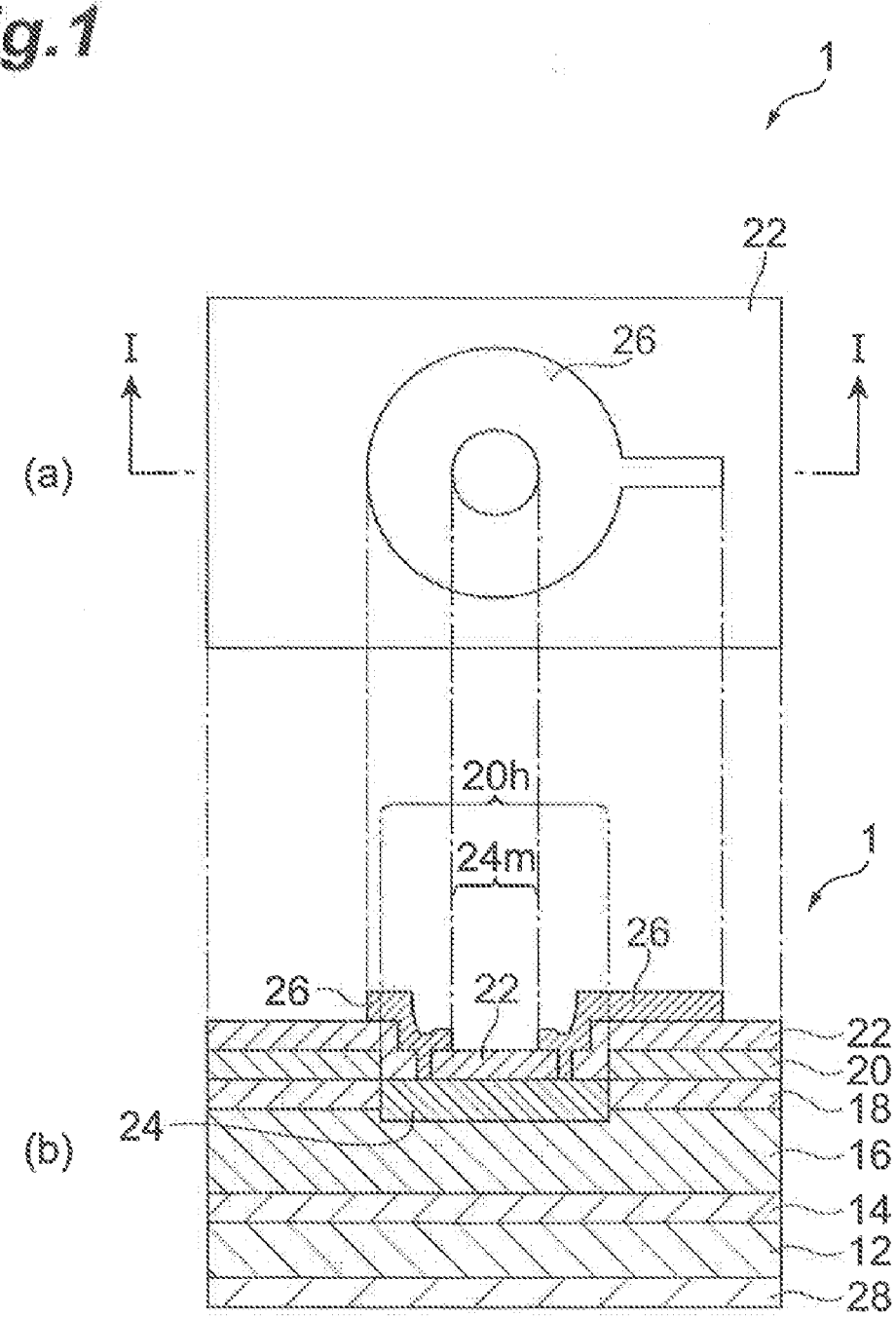
FIG. 1 A view showing a photodetector according to a first embodiment of the present invention.

DESCRIPTION OF REFERENCE NUMERALS AND SYMBOLS 1, 1A, 1B, 1C . . . photodetector, 12 . . . n-type InAs substrate, 14 . . . n-type InAs buffer layer, 16 . . . n-type InAs light absorbing layer, 18, 18A . . . n-type $InAs_XP_YSb_{1-X-Y}$ cap layer, 20, 20A . . . first inorganic insulating film, 20h . . . opening portion, 22, 22A . . . second inorganic insulating film, 24, 24A, 24B . . . p-type impurity semiconductor layer, 24m . . . light receiving region, 26, 26A, 28 . . . wiring electrode.

BEST MODES FOR CARRYING OUT THE INVENTION

Hereinafter, preferred embodiments of the present invention will be described in detail with reference to the drawings. Also, the same or corresponding parts are denoted with the same reference numerals and characters in each drawing.

First Embodiment

FIG. 1 is a view showing a photodetector according to a first embodiment of the present invention. In FIG. 1(a), shown is a photodetector viewed from a light receiving surface side, and in FIG. 1(b), shown is a sectional view along a line I-I in FIG. 1(a).

The photodetector 1 shown in FIG. 1 is a planar photodiode. In the photodetector 1, deposited on an n-type (first conductivity-type) InAs substrate 12 is an n-type InAs buffer layer 14, an n-type InAs light absorbing layer 16, an n-type $InAs_XP_YSb_{1-X-Y}$ cap layer 18 (X≧0, Y>0), a first inorganic insulating film 20, and a second inorganic insulating film 22, in sequence.

In a central portion of the first inorganic insulating film 20 viewed from the light receiving surface side, an almost circular opening portion 20h opened in the deposition direction is formed, and by diffusing a p-type (second conductivity-type) impurity from this opening portion 20h, a p-type impurity semiconductor region 24 is formed. The depth of the p-type impurity semiconductor region 24 reaches from the cap layer 18 to an upper layer of the light absorbing layer 16. As the p-type impurity, for example, Zn or Cd is used. Thus, a p-n junction is formed at a boundary between the p-type impurity semiconductor region 24 and the n-type light absorbing layer 16.

The impurity concentration of the light absorbing layer 16 is lower than that of the p-type impurity semiconductor region 24. This makes it likely that a depletion layer to be generated in the vicinity of the p-n junction portion spreads to the light absorbing layer 16 side, and the thickness of the depletion layer results in a large thickness. As a result, the light receiving sensitivity is improved. In order to improve crystallinity of the light absorbing layer 16, the buffer layer 14 and the cap layer 18 are provided so as to sandwich the light absorbing layer 16 therebetween.

The cap layer 18 is made from $InAs_XP_YSb_{1-X-Y}$ including at least P and Sb out of As, P, and Sb, besides In. Here, X denotes a composition ratio of As. As will be described later, X results in zero or more due to the manufacturing method. The $InAs_XP_YSb_{1-X-Y}$ can have lattice matching with InAs at a high degree of lattice matching. In the present embodiment, the composition ratio of As, P, and Sb is adjusted so that the degree of lattice matching between the cap layer 18 and the light absorbing layer 16 becomes within ±0.1%. Moreover, the thickness of the cap layer 18 is preferably 0.8 μm or more and 1.4 μm or less, and more preferably, 1.0 μm or more and 1.4 μm or less.

Figure 2:
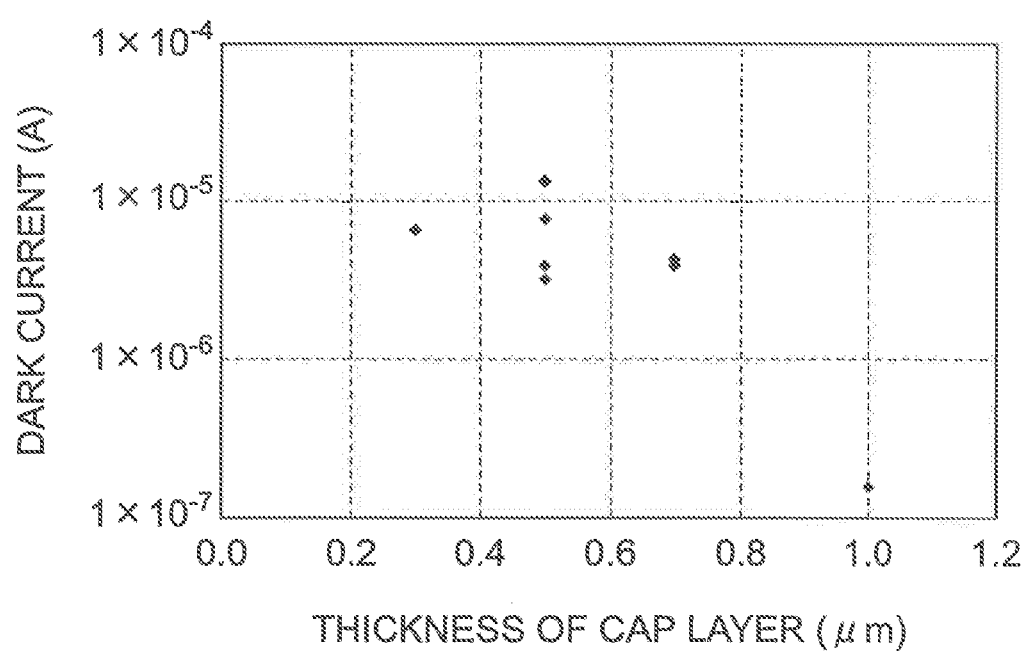
FIG. 2 Measurement results of dark current to the thickness of a cap layer.

FIG. 2 shows measurement results of dark current to the thickness of a cap layer. According to FIG. 2, it can be understood that, as the cap layer 18 is made thicker, the dark current begins to decrease from 0.7 μm, and at 1.0 μm, the dark current has decreased to the order of nano amperes. Thus, if the thickness of the cap layer 18 is 0.8 μm or more, the dark current can be reduced. If the thickness of the cap layer 18 is 1.0 μm or more, the dark current can further be reduced.

Moreover, if the thickness of the cap layer 18 is 1.4 μm or less, an increase in light absorption in the p-type impurity semiconductor region 24 formed by dispersing a p-type impurity into the cap layer 18 can be suppressed, and an increase in diffusion time of the p-type impurity semiconductor layer 24, more specifically, an increase in manufacturing time of the photodetector 1 can be suppressed.

Returning to FIG. 1, as the material of the first inorganic insulating film 20 and the second inorganic insulating film 22, for example, $Si_3N_4$ or $SiO_2$ is used. These inorganic insulating films are excellent in moisture resistance.

The second inorganic insulating film 22 is formed on the p-type impurity semiconductor region 24 and the first inorganic insulating film 20. The second inorganic insulating film 22 functions as a protecting layer of the opening portion 20h used for a formation of the p-n junction portion and a reflection preventing film of a to-be-detected light that is made incident into a light receiving region 24m.

In this second inorganic insulating film 22, a ring-shaped opening portion is provided in the deposition direction, and a ring-shaped contact layer (not shown) and a ring-shaped wiring electrode 26 are provided in this opening portion, in order. Since the diameter of the opening portion is smaller than that of the opening portion 20h of the first inorganic insulating film 20, the wiring electrode 26 is electrically connected to the p-type impurity semiconductor layer 24 via the contact layer. As the material of the contact layer, for example, a material having high ohmic properties such as AuZn or Ti/Pt/Au is used, and as the material of the wiring electrode 26, for example, Ti/Pt/Au, Ti/Pt/AuZn, Ti/Au, or Cr/Au is used.

Moreover, a wiring electrode 28 is provided on the lower side of the substrate 12. As the material of the wiring electrode 28, for example, AuGe/Ni/Au is used.

Figure 3:
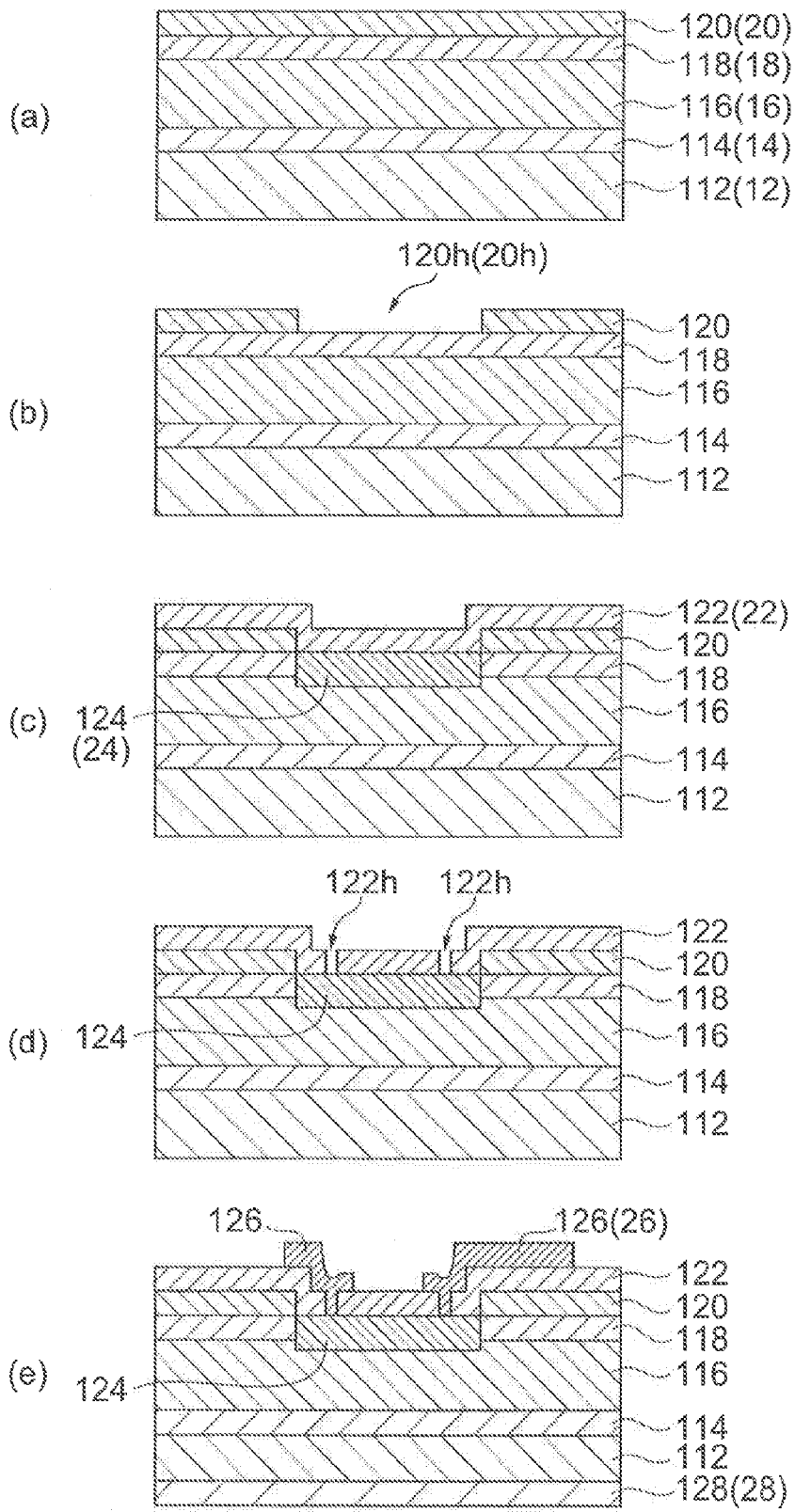
FIG. 3 A sectional view showing manufacturing steps of the photodetector shown in FIG. 1.

Next, description will be given of a manufacturing method of the photodetector 1. FIG. 3 is a sectional view showing manufacturing steps of the photodetector.

(First Deposition Step)

First, a deposited structure of semiconductor layers is formed on an n-type InAs substrate 112(12). As shown in FIG. 3(a), formed on the n-type InAs substrate 112 is an n-type InAs buffer layer 114(14), an n-type InAs light absorbing layer 116(16), and an n-type $InAs_XP_YSb_{1-X-Y}$ cap layer 118(18), in sequence. These semiconductor layers are grown by, for example, OrganoMetallic Vapor Phase Epitaxy (OM-VPE), Liquid Phase Epitaxy (LPE), or Molecular Beam Epitaxy (MBE). In the following, OrganoMetallic Vapor Phase Epitaxy will be exemplified.

First, by supplying a group III material gas containing In and a group V material gas containing As into a crystal growth furnace, the n-type InAs buffer layer 114 and the n-type InAs light absorbing layer 116 are formed, in sequence. Next, the supply of the group V material gas containing As is stopped and a supply of a group V material gas containing P and Sb is started to form an n-type $InAs_XP_YSb_{1-X-Y}$ cap layer ($X \geqq 0$, $Y > 0$) 118(18). Thus, the supply of the V group material gas is stopped when the cap 118 is formed. However, there may be a case where As remains in the crystal growth furnace, so that the composition ratio X of As in the formed cap layer 118 results in zero or more. Also, the supply of the group V material gas containing As may be continued.

Subsequently, a first inorganic insulating film 120(20) is formed as a protecting film on the cap layer 118. The first inorganic insulating film 120 is grown by Chemical Vapor Deposition (CVD).

(Opening Portion Forming Step)

Then, as shown in FIG. 3(b), a central portion of the first inorganic insulating film 120 is removed by etching using photolithography to form an almost circular opening portion 120h (20h) in the deposition direction.

(Diffusion Step)

Then, as shown in FIG. 3(c), by supplying a material gas containing Zn or Cd as a p-type impurity into the crystal growth furnace, the p-type impurity is thermally diffused from the cap layer 118 to an upper layer of the light absorbing layer 116 by use of the opening portion 120h of the first inorganic insulating film 120 to form in a p-type impurity semiconductor region 124(24).

(Second Deposition Step)

Then, a second inorganic insulating film 122(22) is formed on the first inorganic insulating film 120 and the p-type impurity semiconductor region 124. The second inorganic insulating film 122 is grown by Chemical Vapor Deposition.

(Electrode Forming Step)

Then, as shown in FIG. 3(d), a central portion of the second inorganic insulating film 122 is removed in a ring shape by etching using photolithography to form a ring-shaped opening portion 122h in the deposition direction. Thereafter, as shown in FIG. 3(e), a ring-shaped contact layer and a ring-shaped wiring electrode 126(26) are formed in this opening portion 122h, in order. Next, after the bottom surface of the substrate 112 is scraped to a predetermined thickness, a wiring electrode 128(28) is formed.

Thus, according to the photodetector 1 of the first embodiment, the p-n junction portion formed by the p-type impurity semiconductor region 24 and the n-type light absorbing layer 16 is coated with the inorganic insulating film excellent in moisture resistance. Accordingly, not only can reliability be improved, but dark current can also be reduced. Furthermore, since the layers other than the p-type impurity semiconductor region 24 including the light receiving region 24m are coated double with the first inorganic insulating film 20 and the second inorganic insulating film 22, dark current can further be reduced.

Moreover, according to the photodetector 1 of the first embodiment, since the thickness of the cap layer 18 is 0.8 μm or more and 1.4 μm or less, dark current can be reduced without greatly increasing light absorption in the p-type impurity semiconductor region 24 that is formed by diffusing the p-type impurity into the cap layer 18, or without greatly increasing the diffusion time of the p-type impurity semiconductor region 24, more specifically, the manufacturing time of the photodetector 1.

Moreover, according to the photodetector 1 of the first embodiment, since the light absorbing layer 16 and the cap layer 18 are fowled of InAs and $InAs_XP_YSb_{1-X-Y}$, respectively, having a high degree of lattice matching, the degree of lattice matching between the light absorbing layer 16 and the cap layer 18 can be improved, and crystal distortion can be reduced.

Moreover, according to the photodetector 1 of the first embodiment, since the p-type impurity semiconductor region 24 reaches from the cap layer 18 to the upper layer of the n-type light absorbing layer 16, a sufficient absorption length can be secured to the wavelength of a to-be-detected light (for example, light in the infrared region). As a result, the light receiving sensitivity to the wavelength of a to-be-detected light can be improved.

Second Embodiment

Figure 4:
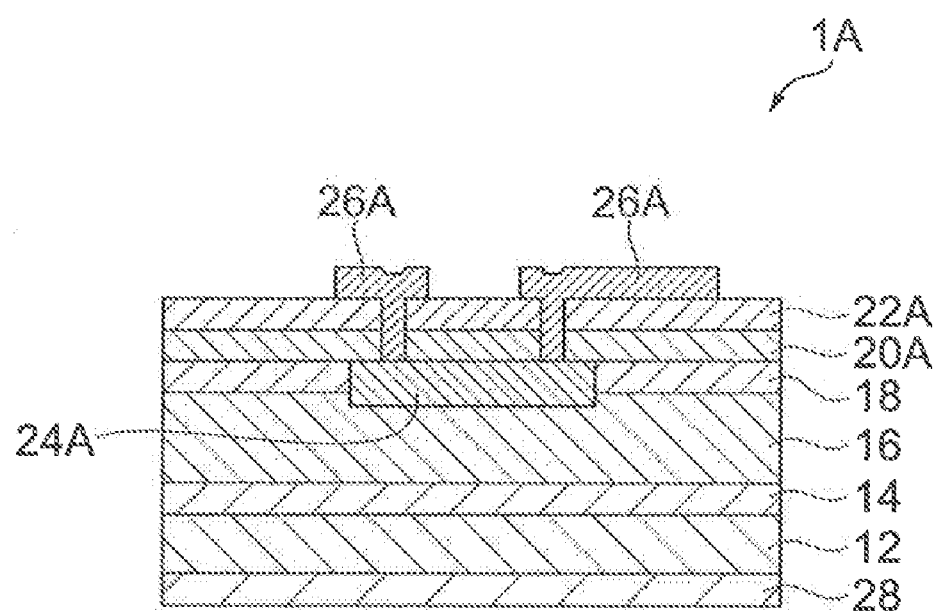
FIG. 4 A sectional view showing a photodetector according to a second embodiment of the present invention.

FIG. 4 is a sectional view showing a photodetector according to a second embodiment of the present invention. The photodetector 1A shown in FIG. 4 differs from the first embodiment 1 in configuration including a first inorganic insulating film 20A, a second inorganic insulating film 22A, a p-type impurity semiconductor region 24A, and a wiring electrode 26A, respectively, in place of the first inorganic insulating film 20, the second inorganic insulating film 22, the p-type impurity semiconductor region 24, and the wiring electrode 26 in the photodetector 1. Other aspects of the configuration of the photodetector 1A are the same as those of the first embodiment.

The first inorganic insulating film 20A is formed on the cap layer 18. For the first inorganic insulating film 20A, identical material to that of the first inorganic insulating film 20 mentioned above is used.

In a central portion of the cap layer 18 and a central portion of an upper layer of the light absorbing layer 16 viewed from the light receiving surface side, the p-type impurity semiconductor region 24A is formed. The p-type impurity semiconductor region 24A is formed by ion-implanting the p-type impurity via the first inorganic insulating film 20A. The depth of the p-type impurity semiconductor region 24A reaches from the cap layer 18 to the upper layer of the light absorbing layer 16. The p-type impurity is identical to the p-type impurity in the p-type impurity semiconductor region 24 mentioned above. Thus, a p-n junction is formed at a boundary between the p-type impurity semiconductor region 24A and the n-type light absorbing layer 16.

The second inorganic insulating film 22A is formed on the first inorganic insulating film 20A. For the second inorganic insulating film 22A, identical material to that of the second inorganic insulating film 22 mentioned above is used. The first inorganic insulating film 20A and the second inorganic insulating film 22A function as protecting layers of the semiconductor layer and reflection preventing films of incident light.

In a central portion of these first and second inorganic insulating films 20A and 22A, a ring-shaped opening portion is provided, and formed in this opening portion is a contact layer (not shown) and a wiring electrode 26A, in order. Since the diameter of the ring-shaped opening portion is smaller than that of the p-type impurity semiconductor region 24A, the wiring electrode 26A is electrically connected to the p-type impurity semiconductor region 24A via the contact layer. For the contact layer and the wiring electrode 26A, identical materials to those of the contact layer and the wiring electrode 26 described above are used, respectively.

Figure 5:
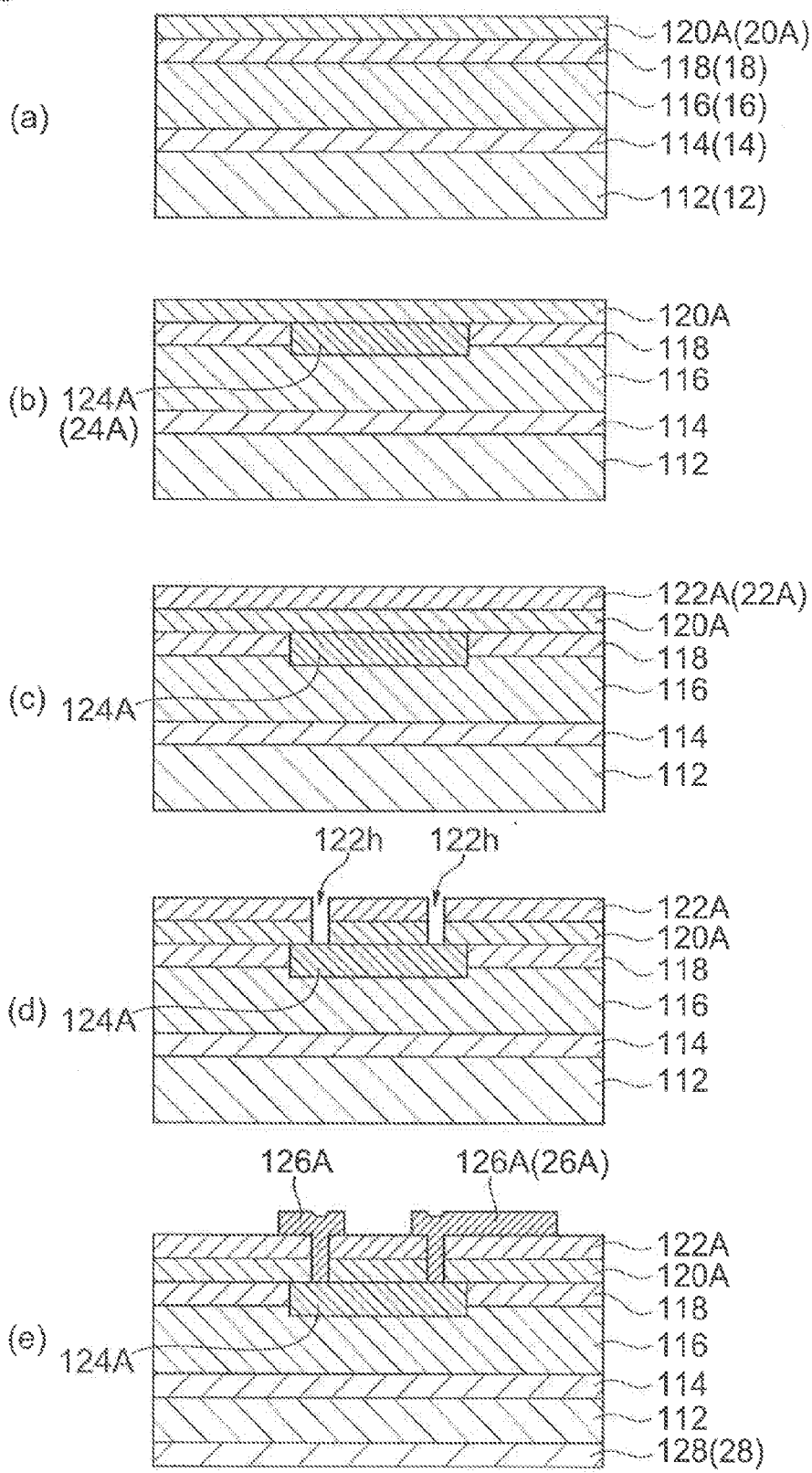
FIG. 5 A sectional view showing manufacturing steps of the photodetector shown in FIG. 4.

Next, description will be given of a manufacturing method of the photodetector 1A. FIG. 5 is a sectional view showing manufacturing steps of the photodetector.

(First Deposition Step)

First, as shown in FIG. 5(a), in the same manner as in the first embodiment, formed on the n-type InAs substrate 112 (12) is an n-type InAs buffer layer 114(14), an n-type InAs light absorbing layer 116(16), an n-type $InAs_XP_YSb_{1-X-Y}$ cap layer 118(18) (X≧0, Y>0), and a first inorganic insulating film 120A (20A), in sequence.

(Ion Implantation Step)

Then, as shown in FIG. 5(b), by implanting ions of Zn or Cd as a p-type impurity into a central portion of the first inorganic insulating film 120A from the light receiving surface side using a resist prepared by photolithography (not shown) as a mask, the p-type impurity is ion-implanted via the first inorganic insulating film 120A from the cap layer 118 to an upper layer of the light absorbing layer 116 to form a p-type impurity semiconductor region 124A(24A). Subsequently, the resist used for the mask is removed, and then an annealing treatment by heating is performed. This activates the implanted p-type impurity and reduces implantation damage.

(Second Deposition Step)

Next, as shown in FIG. 5(c), in the same manner as in the first embodiment, a second inorganic insulating film 122A (22A) is formed on the first inorganic insulating film 120A.

(Electrode Forming Step)

Then, as shown in FIG. 5(d), a central portion of the first inorganic insulating film 120A and the second inorganic insulating film 122A is removed by etching using photolithography to form a ring-shaped opening portion 122h in the deposition direction. Thereafter, as shown in FIG. 5(e), a ring-shaped contact layer and a ring-shaped wiring electrode 126A (26A) are formed in this opening portion 122h, in order. Next, after the bottom surface of the substrate 112 is scraped to a predetermined thickness, a wiring electrode 128(28) is formed.

Thus, according to the photodetector IA of the second embodiment, the p-n junction portion formed by the p-type impurity semiconductor region 24A and the n-type light absorbing layer 16 is coated double with the inorganic insulating films excellent in moisture resistance. Accordingly, not only can reliability be improved, but dark current can also be reduced.

Moreover, in the photodetector 1A of the second embodiment as well, since the thickness of the cap layer 18 is 0.8 μm or more and 1.4 μm or less, dark current can be reduced without greatly increasing light absorption in the p-type impurity semiconductor region 24 that is formed by ion-implanting the p-type impurity into the cap layer 18, or without greatly increasing the ion implantation time of the p-type impurity semiconductor region 24, more specifically, the manufacturing time of the photodetector 1.

Moreover, in the photodetector 1A of the second embodiment as well, since the light absorbing layer 16 and the cap layer 18 are formed of InAs and $InAs_XP_YSb_{1-X-Y}$, respectively, having a high degree of lattice matching, the degree of lattice matching between the light absorbing layer 16 and the cap layer 18 can be improved, and crystal distortion can be reduced.

Moreover, in the photodetector 1A of the second embodiment as well, since the p-type impurity semiconductor region 24A reaches from the cap layer 18 to the upper layer of the n-type light absorbing layer 16, a sufficient absorption length can be secured to the wavelength of a to-be-detected light (for example, light in the infrared region). As a result, the light receiving sensitivity to the wavelength of a to-be-detected light can be improved.

Third Embodiment

Figure 6:
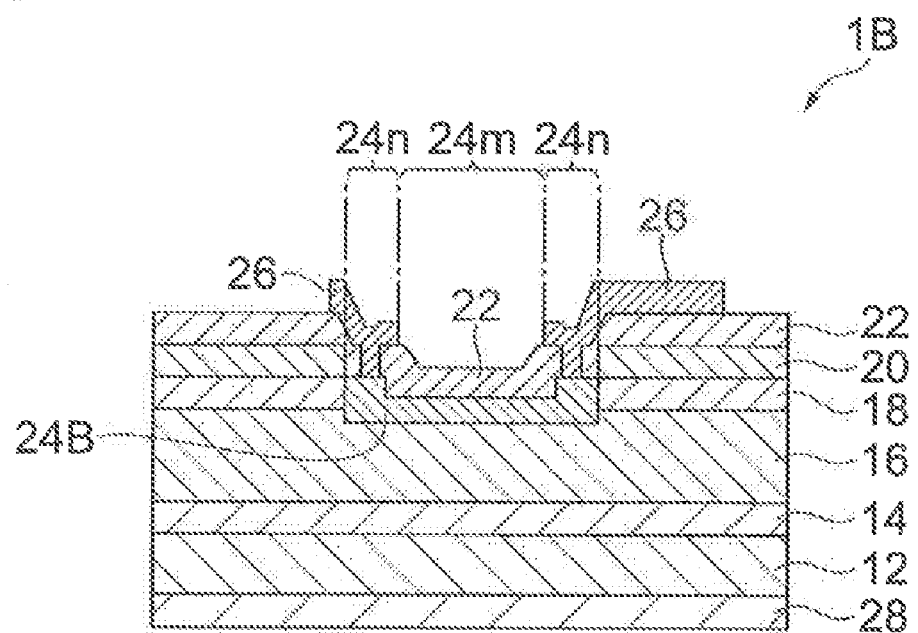
FIG. 6 A sectional view showing a photodetector according to a third embodiment of the present invention.

FIG. 6 is a sectional view showing a photodetector according to a third embodiment of the present invention. The photodetector 1B shown in FIG. 6 differs from the first embodiment 1 in configuration including a p-type impurity semiconductor region 24B in place of the p-type impurity semiconductor region 24 in the photodetector 1. Other aspects of the configuration of the photodetector 1B are the same as those of the first embodiment.

In the p-type impurity semiconductor region 24B, the upper layer of a region including the light receiving region 24m is scraped in the p-type impurity semiconductor region 24. In this manner, the thickness of the light receiving region 24m in the p-type impurity semiconductor region 24B is made thinner than the thickness of a non-light receiving region 24n and the thickness of the cap layer 18.

In the photodetector 1B of the third embodiment as well, the same advantages as those of the photodetector 1 of the first embodiment can be obtained. Furthermore, according to the photodetector 1B of the third embodiment, the thickness of the light receiving region 24m in the p-type impurity semiconductor region 24B can be reduced without reducing the thickness of the cap layer 18, and thus light absorption in the p-type impurity semiconductor region 24B can be reduced without increasing dark current.

Fourth Embodiment

Figure 7:
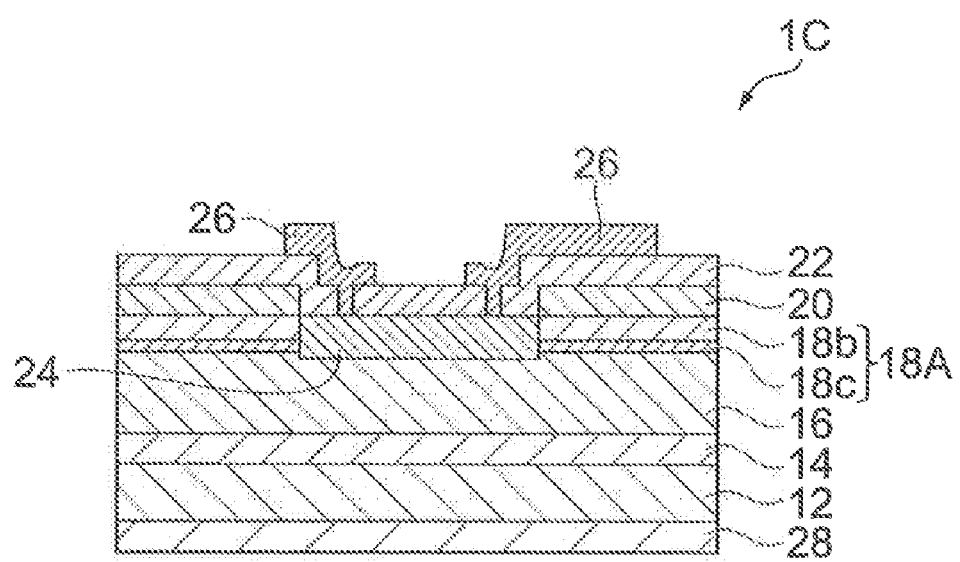
FIG. 7 A sectional view showing a photodetector according to a fourth embodiment of the present invention.

FIG. 7 is a sectional view showing a photodetector according to a fourth embodiment of the present invention. The photodetector 1C shown in FIG. 7 differs from the first embodiment 1 in configuration including a cap layer 18A in place of the cap layer 18 in the photodetector 1. Other aspects of the configuration of the photodetector 1C are the same as those of the first embodiment.

The cap layer 18A is made from $InAs_XP_YSb_{1-X-Y}$ ($X \geq 0$, $Y>0$) as with the cap layer 18, and the composition ratio of As, P, and Sb is adjusted so that the degree of lattice matching between the cap layer 18A and the light absorbing layer 16 becomes within ±0.1%. The cap layer 18A is composed of an upper layer 18b and a lower layer 18c. The n-type impurity concentration of the upper layer 18b is the same as that of the cap layer 18. On the other hand, the lower layer 18c is a graded layer, therein the concentration distribution of an n-type impurity slopes so that the concentration increases from the light absorbing layer 16 toward the upper layer 18b of the cap layer.

In the photodetector 1C of the fourth embodiment as well, the same advantages as those of the photodetector 1 of the first embodiment can be obtained. Furthermore, according to the photodetector 1C of the fourth embodiment, the concentration of an n-type impurity in at least a part of the lower layer 18c of the cap layer 18A increases continuously or in a graded manner, and thus the energy band gap increases from the light absorbing layer 16 toward the upper layer 18b of the cap layer continuously or in a graded manner. Accordingly, carriers migrate smoothly, which allows operating at a high speed.

Also, the present invention is not limited to the present embodiments mentioned above, and various modifications can be made. For example, in the above-mentioned embodiments, the first conductivity type was provided as the n-type, and the second conductivity type, as the p-type, however, it may also be possible to provide the first conductivity type as the p-type, and the second conductivity type, as the n-type, conversely.

Moreover, in the first embodiment, when the p-type impurity semiconductor region is prepared, diffusion was performed by supplying the material gas containing Zn or Cd as a p-type impurity into the crystal growth furnace, however, it is possible to perform diffusion by filling a Zn compound and the substrate of FIG. 3(b) in a quartz tube and heating the same.

Moreover, in the fourth embodiment, the light receiving region of the p-type impurity semiconductor layer in the photodetector of the first embodiment has been thinned, however, it is possible to likewise thin the light receiving region of the p-type impurity semiconductor region in the photodetector of the second embodiment as well.

Moreover, in the fourth embodiment, the lower layer of the cap layer in the photodetector of the first embodiment has been provided as a graded layer, however, it is possible to provide likewise the lower layer of the cap layer as a graded layer in the photodetector of the second embodiment as well.

The invention claimed is:
1. A photodetector comprising:
a first conductivity-type InAs substrate;
a first conductivity-type InAs buffer layer formed on the first conductivity-type InAs substrate;
a first conductivity-type InAs light absorbing layer formed on the first conductivity-type InAs buffer layer;
a cap layer formed on the first conductivity-type InAs light absorbing layer, and made from $InAs_XP_YSb_{1-X-Y}$ ($X \geq Y>0$) containing In and at least two of As, P, and Sb;
a first inorganic insulating film formed on the cap layer;
a second conductivity-type impurity semiconductor region formed by ion-implanting a second conductivity-type impurity via the first inorganic insulating film, and reaching from the cap layer to an upper layer of the first conductivity-type InAs light absorbing layer; and
a second inorganic insulating film formed on the first inorganic insulating film.

* * * * *